United States Patent
Shepard

(10) Patent No.: US 8,710,353 B2
(45) Date of Patent: Apr. 29, 2014

(54) SOLAR ENERGY CONVERTER WITH IMPROVED PHOTOVOLTAIC EFFICIENCY, FREQUENCY CONVERSION AND THERMAL MANAGEMENT PERMITTING SUPER HIGHLY CONCENTRATED COLLECTION

(75) Inventor: Scott Roger Shepard, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 979 days.

(21) Appl. No.: 12/488,132

(22) Filed: Jun. 19, 2009

(65) Prior Publication Data

US 2009/0314333 A1 Dec. 24, 2009

Related U.S. Application Data

(60) Provisional application No. 61/074,298, filed on Jun. 20, 2008.

(51) Int. Cl.
- *H01L 31/052* (2014.01)
- *G02F 1/365* (2006.01)
- *H01S 3/067* (2006.01)

(52) U.S. Cl.
USPC .............. 136/248; 136/246; 359/353; 385/28

(58) Field of Classification Search
None
See application file for complete search history.

(56) References Cited

U.S. PATENT DOCUMENTS

| | | | | |
|---|---|---|---|---|
| 4,172,740 A | * | 10/1979 | Campbell, III | 136/206 |
| 4,675,067 A | * | 6/1987 | Valley | 156/345.23 |
| 5,089,055 A | * | 2/1992 | Nakamura | 136/248 |
| 5,431,742 A | * | 7/1995 | Kleinerman | 136/247 |
| 5,575,860 A | * | 11/1996 | Cherney | 136/245 |
| 6,080,927 A | | 6/2000 | Johnson | |
| 7,381,886 B1 | | 6/2008 | Aiken | |
| 2001/0046244 A1 | * | 11/2001 | Klimov et al. | 372/43 |
| 2002/0148497 A1 | * | 10/2002 | Sasaoka et al. | 136/243 |
| 2004/0011395 A1 | * | 1/2004 | Nicoletti et al. | 136/246 |
| 2006/0239605 A1 | | 10/2006 | Palen | |
| 2007/0002433 A1 | | 1/2007 | Chen | |
| 2007/0034250 A1 | * | 2/2007 | Dutta | 136/244 |
| 2008/0023062 A1 | | 1/2008 | Barksdale | |
| 2008/0041441 A1 | | 2/2008 | Schwartzman | |

* cited by examiner

Primary Examiner — Jennifer Michener
Assistant Examiner — Christopher Danicic
(74) Attorney, Agent, or Firm — Brian S. Steinberger; Phyllis K. Wood; Law Offices of Brian S. Steinberger, P.A.

(57) ABSTRACT

Methods and systems for solar energy converter with increased photovoltaic and thermal conversion efficiencies including a collection optics for receiving and concentrating incident sunlight, or radiation from any other directed electromagnetic energy source, an optical filtering unit for separating and redirecting infrared light and ultraviolet light from incoming solar light, a thermal distribution unit redirecting heat from the optical filtering unit into a thermal-loop, and a photovoltaic for receiving the filtered light from the filtering system and converting the light into energy.

29 Claims, 14 Drawing Sheets

US 8,710,353 B2

SOLAR ENERGY CONVERTER WITH IMPROVED PHOTOVOLTAIC EFFICIENCY, FREQUENCY CONVERSION AND THERMAL MANAGEMENT PERMITTING SUPER HIGHLY CONCENTRATED COLLECTION

This application claims the benefit of priority to U.S. Provisional application No. 61/074,298 filed on Jun. 20, 2008.

FIELD OF THE INVENTION

This invention relates to solar energy collection and, in particular, to methods, apparatus and systems for solar energy conversion with improved photovoltaic efficiency, frequency conversion and thermal management permitting super highly concentrated collection of solar energy.

BACKGROUND AND PRIOR ART

Applicant is not aware of any published material related to the use of optical fiber (in any way) in a solar energy converter. After an extensive literature search in December 2007, Applicant was able to find one paper proposing frequency conversion in a thin-film layer on top of a photovoltaic [Richards and Shalav, Synthetic Metals, 154 (2005) 61-64]. The approach described in the found literature is limited to almost single-pass conversion efficiency although some guiding can happen in a layer and it wouldn't have the many other advantages that fiber offers including thermal management, realm of super high concentration, etc. to name a few.

A primary objective of the present invention is to provide methods and systems to increase the efficiency of a photovoltaic (PV) via optical filtering and concentration of the incident sunlight (or radiation from any other directed electromagnetic energy source).

A secondary objective of the present invention is to provide methods and systems to frequency convert the filtered energy so that it's within the response range for photovoltaic conversion.

A third objective of the present invention is to provide methods and systems to achieve the optical filtering and/or frequency conversion in conjunction with a solar thermal loop into which out-of-band energy is directed via radiative and conductive couplings.

A fourth objective of the present invention is to provide methods and systems to permit operation in previously unachievable realms of super highly concentrated solar irradiance.

A solar energy system with increased photovoltaic and thermal conversion efficiencies including a collection optics for receiving and concentrating incident sunlight, or radiation from any other directed electromagnetic energy source, an optical filtering unit for separating and redirecting infrared light and ultraviolet light from incoming solar light, a thermal distribution unit redirecting heat from the optical filtering unit into a thermal-loop, and a photovoltaic for receiving the filtered light from the filtering system and converting the light into electrical energy. The optical filtering unit can include an optical waveguide or an optical fiber selected from a group consisting of fiber, bundle of optical fibers, tapered rods, tapered fiber, photonic crystal fiber (PCF), multi-core, multi-clad, slab waveguides and hexagonal rod and can be a dielectric material or a glass material. Additionally, the optical waveguide uses one of a total internal reflection (TIR) and a transverse resonance to achieve electromagnetic confinement and guidance. The collection optics can be a Fresnel lens, a parabolic dish mirror, or a parabolic trough mirror and the entrance optics can be a window-filter, rod, tapered rod, multi-lens array, ball lens or lensed fiber. The filtering by the optical filtering unit is accomplished via at least one of the absorptive properties of the optics and the fiber, the chromatic aberration of the optics and the fiber, waveguiding and angle-tuning of the fiber to optimize the spectral transfer.

The thermal distribution unit redistributes heat by at least one of a conductive coupling of the heat to the thermal loop and a radiative coupling the heat from the optical filtering unit into the thermal loop. The optical fiber can be a fiber bundle of input heads that are epoxied together, a fiber bundles of input heads that are fused together, a fiber bundles of input heads having claddings removed and cores fused together or a metallic ferrule for housing the fiber bundle of input heads and a heat sink mesh between fibers in a bundle. The thermal distribution unit can also include a coolant with the optical fibers routed through the coolant and/or a heat pipe or heat pipes arrayed in a radial arm to a ring topology to rapidly transfer thermal energy collection optics into a manifold that interfaces the coolant flow to the rest of the thermal loop. The coolant, heat pipe or heat pipes arrayed in a radial arms to a ring topology are thermally insulated and can an evacuated glass tube.

The system can also include a frequency converter to convert a ultraviolet and a infrared radiation to a visible band that the photovoltaic is responsive to. In this example, the optical fibers in the bundle have claddings to form cladding pumped fiber amplifiers and can include a mirror and a fiber Bragg grating coupled to both ends of the optical fibers to form cladding pumped fiber lasers. The inner conduction tube can also form a single fiber amplifier with waveguiding of the amplifier providing a preferred direction for the re-radiation of the solar pumped molecules or atoms undergoing stimulated emission of radiation and a mirror at an ends of the inner conduction tube enhancing the direction for a stimulated emission, turning the amplifier into a laser. The laser is end pumped by one of a Fresnel lens and a dish mirror or side pumped by a trough mirror and grating at top of tube providing distributed feedback DFB eliminating mirrors at end of tube. The frequency conversion is resonantly enhanced in an optical resonator can be a fiber ring resonators incorporating couplers, a fiber ring resonators incorporating hybrid fiber/bulk-optics modules, a reflective resonators incorporating optical circulators and a fiber Bragg grating FBG and a mirror or a fiber based resonator.

In an embodiment, the collector includes a concentrated light beam source is one of an array of mirrors in a solar farm, a solar pumped lasers from one of a terrestrial, satellite, or platforms in the solar system, the collector receiving the concentrated light beam Further objects and advantages of this invention will be apparent from the following detailed description of preferred embodiments which are illustrated schematically in the accompanying drawings.

DESCRIPTION OF THE PREFERRED EMBODIMENTS

Figure 1A:
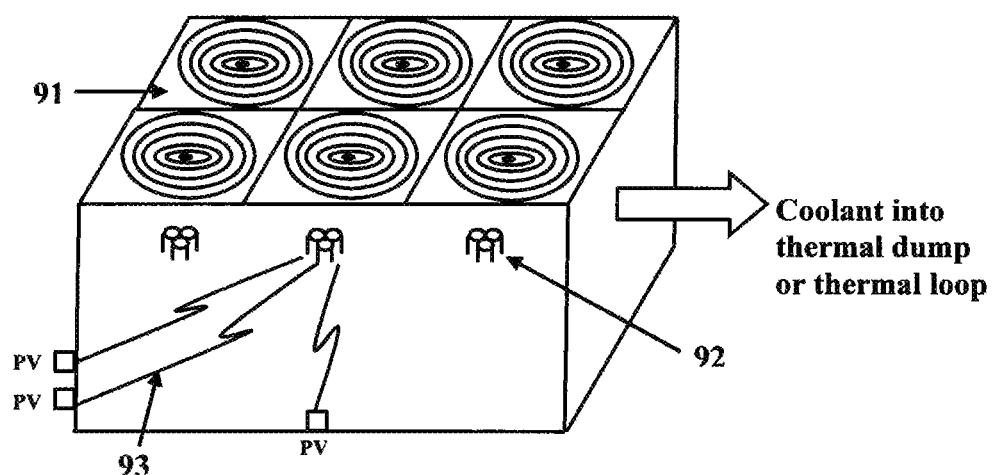
FIG. 1a shows lens implementations of the solar energy system according to the present invention.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The following is a list of the reference numbers used in the drawings and the detailed specification to identify components:
14 WDM coupler
15 nonlinear fiber or fiber/bulk nonlinear optics
16 optical isolator
17 fiber Bragg grating
20 fiber Bragg grating or fiber/bulk mirror
30 optical circulator
31 parabolic trough mirror
33 tube
40 mirror
43 fiber/bulk beam splitter module
47 collection optics
48 multi-lens array
49 heat sink
51 outer tube
52 heat pipe
53 thermal conduction tube
54 coolant
55 insulating material
56 fiber input head or ferrule
61 valve
63 ring manifold
71 fiber input structure
72 sunlight
73 entrance optics
74 parabolic dish mirror
77 fiber bundle or optical waveguide
91 Fresnel lens
92 fiber bundle
93 fiber group/legs
210 current
211 electrodes
212 PN junction
213 multiple fibers
214 conductors
215 PV material Use of the phrase "optical fiber" herein generally refers to any such optical waveguide of any dielectric, glass, or other material of any size including rods, lightpipes, fiber bundles, multi-mode fiber, single-mode fiber, etc.; and of any shape, including but not limited to, tapered rods, tapered fiber, photonic crystal fiber (PCF), multi-core, multi-clad, slab waveguides, hexagonal rod, etc. Most of optical fibers utilize total internal reflection (TIR) to achieve electromagnetic confinement and guidance of a mode, but photonic crystal fibers and photonic band-gap guides achieve this via mechanisms other than total internal reflection, for example a transverse resonance which has been likened to the way gratings operate. The present invention employs any of these technologies and generally refers to them as "fiber."

Fiber provides numerous alternative methods and systems for performing optical filtering, frequency conversion, and thermal energy distribution, permitting high levels of solar concentration from collection lenses and/or mirrors before passing the in-band energy onto the photovoltaic cells and/or PV systems.

The collection optics can be Fresnel lenses, parabolic dish mirrors, parabolic trough mirrors etc., including the option of utilizing secondary entrance optics and windows for interfacing to the fiber and the solar thermal loop without deviating from the scope of the invention. Any choice of collection optics offers its own filtering aspects via absorption, reflection and chromatic aberration which can be optimized in conjunction with the choice of fiber and/or entrance optics. Due to the flexibility of the fiber's routing and heat transfer properties, the solar thermal loop could be one of many configuration, including but not limited to, absorption chillers Stirling engines, thermo-electric converters, steam engines; etc., depending primarily on the scale, the size and number of optical collection modules, and referred to generically as the "thermal loop."

The configuration in the first set of examples, do not explicitly utilize frequency conversion arising from non-linear optical interactions within the fiber, although UV absorption and re-radiation as heat can be considered as a type of frequency conversion. The fiber can perform filtering and transfer ultraviolet UV and infrared IR energy into the thermal loop via radiative and/or conductive couplings. The first few examples illustrate the use of the fiber in a conductive coupling mode of operation in which the fiber absorbs UV and IR creating heat which is conducted into the thermal loop. The later examples illustrate the use of the fiber in a manner that also utilizes a radiative coupling mode of operation in which the IR is detuned from the multimode entrance angle of the waveguide, so that less of the IR propagates through the fiber and more of the IR is coupled directly into the thermal loop.

The first example of the solar energy system is shown in FIG. 1. The ultraviolet and infrared light, and the band that the photovoltaic has appreciable responsivity to, all undergo multi-mode propagation. For silicon the band is approximately 400 nm to approximately 1125 nm and is referred to herein the "visible" light. In this example, there is no waveguide filtering or angle tuning of these modes, just the filtering effects of the material response of the fiber, i.e., the absorption, re-radiation and conduction of the resulting heat into the thermal loop.

In the configuration shown in FIG. 1, the collection optics of a module is a Fresnel lens 91 and the fiber is a bundle 92 of optical fibers. For small lenses, less than approximately 0.5 m diameter, the bundle's input head 56 inside the metallic ferrule can contain epoxies capable of withstanding relatively low temperatures less than approximately 500 degrees C. For large lenses, greater than approximately 0.5 m diameter, the bundle's input head can contain optical fibers that have been fused together, forming a water tight seal capable of withstanding approximately 1600 degrees C., which is the melting point of most glass fibers, e.g., those similar to silica dioxide.

The bundle of fiber collects the solar energy at the "hot spot" focused by a Fresnel lens then each fiber, or groups of fibers 93, referred to as "legs," in the bundle can snake out in many directions, over long or short distances, throughout the thermal loop. Thus providing efficient heat transfer into the coolant, as the heat conducts into the coolant further along the fiber. Moreover, the scalability can be a significant feature. With fibers of low optical loss there is virtually no limit on the length of the fibers, so they can be used to make the efficiency of the heat transfer extremely high.

Figure 1B:
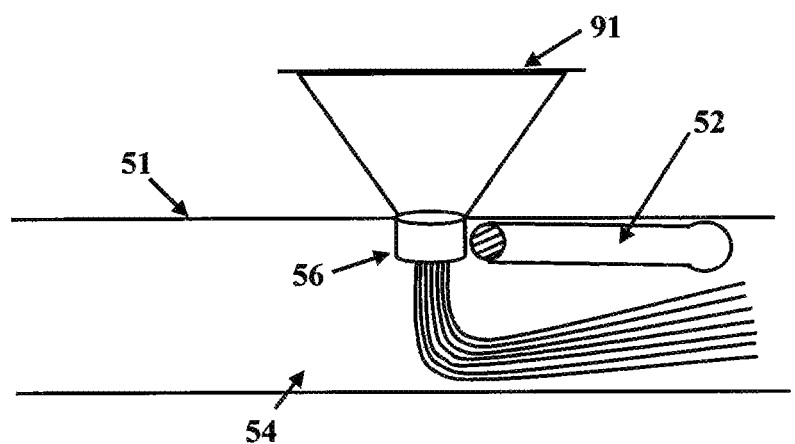
FIG. 1b shows an example using solar energy converter using coolant tubes and heat pipes.

Even with standard telecommunication grade fiber, where the losses are greater at wavelengths near the 850 nm peak responsivity of silicon than the losses are at telecommunication wavelengths near 1550 nm, these larger losses (2 dB/km compared to 0.2 dB/km) are still manageable since, transcontinental lengths are not envisioned for most solar applications. Only approximately a one meter length of fiber is needed to route the light to the photovoltaics on the side of a one meter diameter lens with reasonable bends for negligible bend loss in the fiber. Moreover, fiber attenuation "losses" that are changed into heat are not lost, instead they couple back into the thermal loop. As shown in FIG. 1a, the interface to the thermal loop could take place via an array of lenses on a container of any shape, such as the rectangular shape shown, or via lens modules that interface to coolant 54 carried by tubes 51 that house the fiber and/or fiber input heads 56 as shown in FIG. 1b.

Since the power to the photovoltaic is delivered by fiber, the photovoltaic can be placed upstream in the coolant of the thermal loop where it is cooler than at the hot spot where the energy strikes the fiber bundle, or the fiber can transport the energy to photovoltaics located entirely outside the thermal loop. The hot spot can be located inside the coolant and at a depth that creates an anti-reflective AR coating effect on the incident energy. Reflection losses at the fiber input can be further reduced via the simultaneous use of a Brewster angle and a quarter-wave transformer layer and/or via a standard AR coating on the fiber input head. Chromatic dispersion of the focusing lenses and/or the collecting mirrors can be used to focus the infrared and/or the ultraviolet more into the coolant and the remainder of the light more into the fiber. Heat pipes 52 can also be employed to rapidly transfer thermal energy from the hot spot into the remainder of the thermal loop.

The configuration shown in FIG. 1a does not employ entrance optics, e.g., windows, so the filtering effects rely primarily upon the fiber. Thus a one meter length of ultraviolet fused silica makes an attractive choice with transmission of approximately 99.8% of the light near 800 nm where silicon photovoltaics have large responsivity while attenuating over approximately 20% of the infrared at approximately 1200 nm and beyond.

Figure 2:
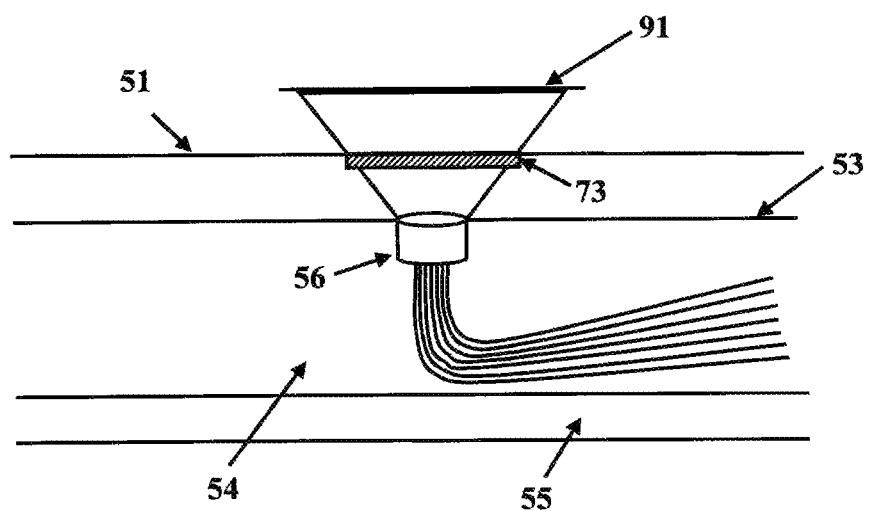
FIG. 2 shows an example using solar energy converter using entrance optics and insulated or evacuated tubes.

The second example shown in FIG. 2 uses entrance optics and a tubular coolant/thermal-loop topology. The entrance optics 73 can mitigate thermal stresses on the coolant aperture by making it a larger area than the fiber bundle input head. This could take the form of tapered rods, or more simply using of the area reduction from the primary collection lens as the beam passes through an entrance optics window as shown in FIG. 2. The window's inherent filtering characteristics can also be utilized to enhance the filtering of the fiber. This also frees up some cost effective choices among fiber types. For example, relatively inexpensive borosilicate fiber which provides less infrared to visible suppression could be used instead of the more expensive ultraviolet fused silica fiber if the entrance optics window provides some of the filtering; while it also conducts into the coolant before the remaining heat is coupled into the fiber which further conducts heat into the coolant as it channels the useful visible light out of the thermal collector and onto the remotely located photovoltaic.

Chromatic aberration of the entrance optics window can also be used to adjust the spectral coupling into the fiber bundle input head instead of into the coolants in the same way the chromatic aberration of the primary lens can be used. The tube can include an outer tube 51 surrounding a thermally insulating material 55 which surrounds an inner thermal conduction tube 53. The thermally insulating material 55 could also be a vacuum.

Figure 3A:
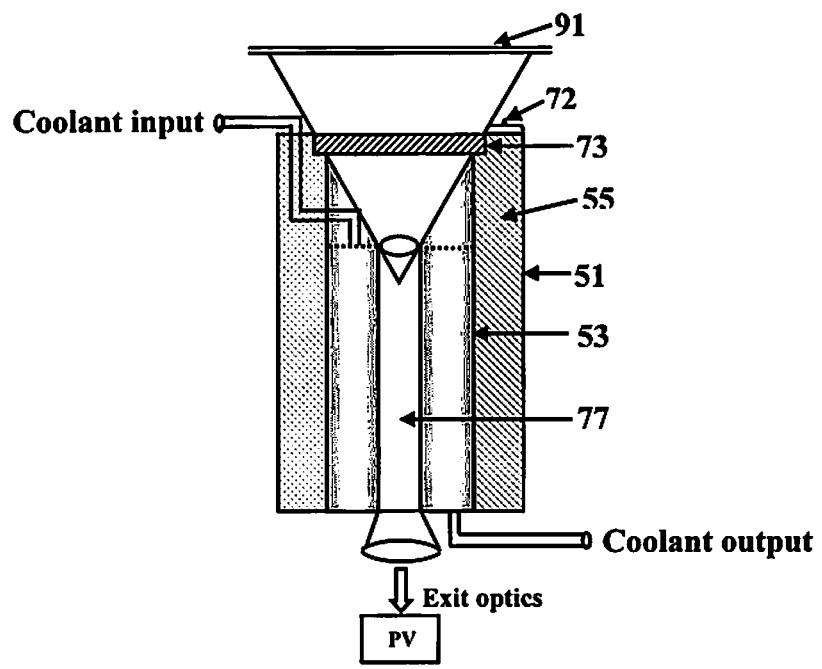
FIG. 3a is a front view of an end-fired tube.

An alternative configuration illustrates how tradeoffs between fiber length and coolant/thermal-loop technology can lead to larger scale modules, efficiently delivering higher levels of visible light and heat transfer from a larger lens or mirror. These configurations can employ evacuated tubes that are commercially available and used in pre-existing solar thermal systems because the vacuum provides greater thermal isolation than any material. Although normally laid flat in the sun, in this example they are end-fired, as shown in FIG. 3a, from the collection optics with the fiber routed down the inner thermal conduction tube 53 with or without entrance optics 73.

Figure 3B:
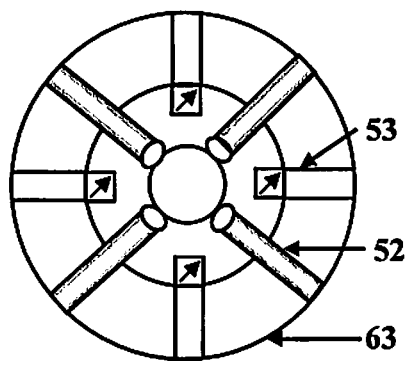
FIG. 3b is a top view of FIG. 3a showing the use of more coolant tubes and heat pipes and a ring manifold which represents coupling to the remainder of the thermal loop.

The inner thermal conduction tube 53 can be metal or glass that is coated with a black material to further absorb ambient radiation from the sides. This inner conduction tube 53 can contain coolant flowing in a variety of different configurations without deviating from the scope of the invention as shown. The coolant inputs and outputs would typically be symmetric, coming from both sides as shown in FIG. 3a or coming from four or more sides as shown in FIG. 3b which shows a top view of this alternative configuration. As shown, heat pipes 52 can help transfer heat out of the hot spot at the fiber input head 56 and the ring manifold 63 represents thermal conduction of the heat pipes 52 and coolant tubes to the remainder of the thermal loop. Valves 61 can be used to select alternate directions of coolant flow while still maintaining back-pressure to prevent turbulence and air bubbles for various temperature ranges of operation and the ring topology permits the use of the type of heat pipes that require elevation, independent of the module's orientation while tracking the sun.

The system shown in FIG. 4 includes the components described for the previous examples with the option of alternate collection optics. FIGS. 4a and 4b show two different configurations for interfacing the fiber to parabolic dish mirror 74 collection optics. The first example shown in FIG. 4a, shows that the incoming sunlight 72 can be strongly coupled via proper arrangement of the fiber input structure 71. The configuration shown in FIG. 4b shows that shadowing can be minimized by stringing the fiber further away from the focal point.

Figure 4A:
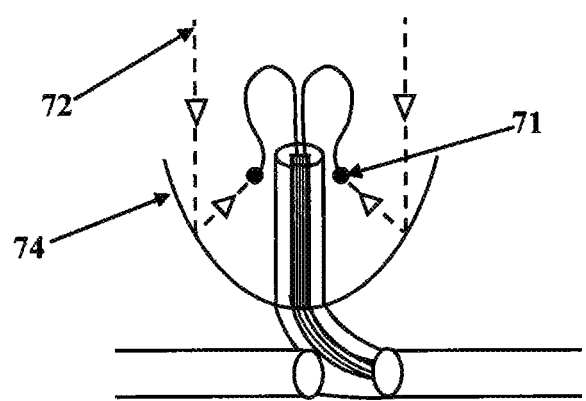
FIG. 4a shows an interfacing to a parabolic dish mirror.
Figure 4B:
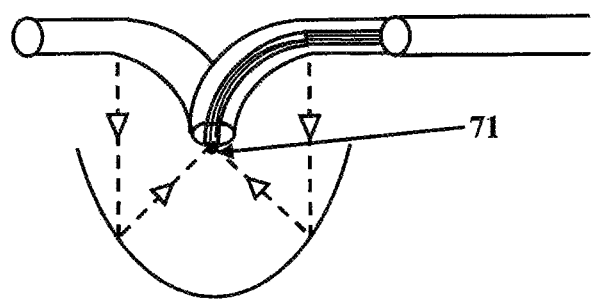
FIG. 4b shows an alternate interfacing to a parabolic dish mirror
Figure 4C:
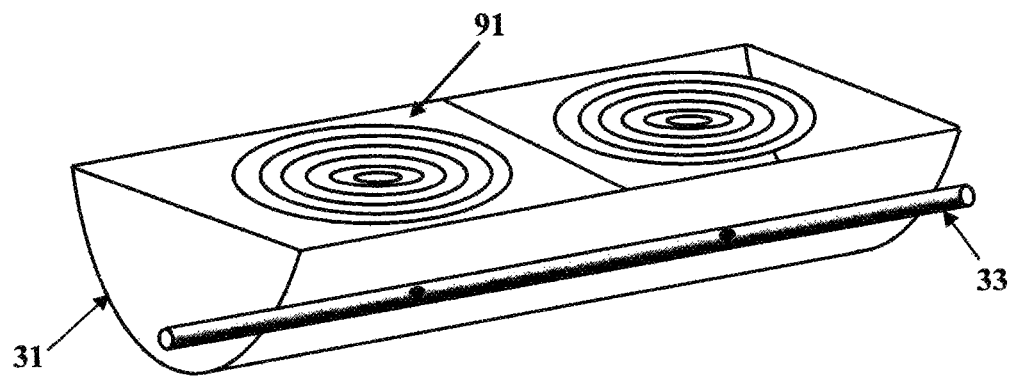
FIG. 4c shows an interfacing to a hybrid lens-trough collector.
Figure 4D:
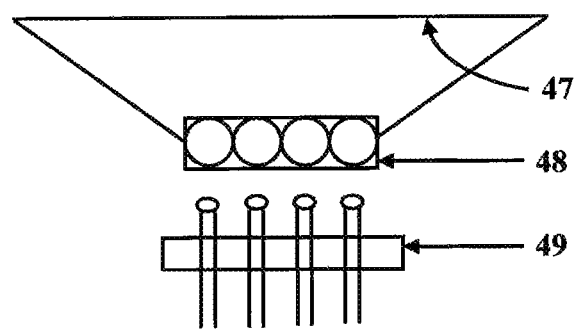
FIG. 4d shows an interfacing to a multi-lens array.

In either configuration, the fiber can be routed upstream and/or downstream in flexible coolant tubes although the figures show the fiber routed in only one direction. FIG. 4c illustrates a hybrid trough-lens system topology in which a Fresnel lens with a large amount of chromatic aberration focuses the visible light onto the fiber bundle while leaving the infrared relatively unfocused so that the infrared passes on to the parabolic trough mirror 31 which focuses the infrared onto the collection tube 33 of the thermal loop. FIG. 4d illustrates how, with any of the primary collection optics 47 topologies, such as lenses, dish, or trough, secondary entrance optics can take the form of multi-lens arrays 48 to focus on the individual fibers, or legs 93, of a fiber bundle 92. This permits greater spacing between the fibers, or legs, for optical and thermal optimizations. Therein a metallic honey-combed array/heat-sink 49 can hold the fibers into the bundle and quickly conduct "front-end" thermal energy into the coolant 54. This honey-combed array/heat-sink 49 could be fabricated by chemical deposition techniques and the spacing between the fibers in the bundle 92 readily optimized for various applications.

Figure 5:
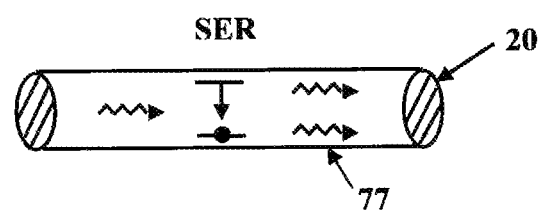
FIG. 5 shows a solar pumped fiber/tube amplifier/laser.

Frequency conversion via processes found in lasers, such as the stimulated emission of radiation, SER, is illustrated in the example of FIG. 5. In some applications the claddings of the fibers in the bundle can be removed and the cores fused at the input head of the bundle to maximize optical transfer into the cores; however, if the claddings are not removed, then they can be utilized to form cladding pumped fiber amplifiers 44. The waveguide or fiber amplifier can be turned into a lasers, by putting mirrors or fiber Bragg gratings, FBGs, 20 on the ends of the waveguide or fibers as shown in FIG. 5.

Referring to FIG. 6 in conjunction with FIGS. 3 and 5, is a similar configuration in that, the entire inner conduction tube 33 can function as a single fiber functioning as a single amplifier; and/or by including mirrors: a single laser. Since a critical angle could still be maintained at the tube to air, or tube to vacuum, interface, even if the tube is filled with fluorescent dyes, like Rhodamine 6G for example, the waveguiding of the amplifier provides a preferred direction for the re-radiation of the solar pumped molecules or atoms. This preferred direction for the stimulated emission can also be enhanced through the use of mirrors at the ends of the tube to turn the amplifier into a laser. Since this is true even if the tube is side pumped instead of end pumped, this also permits the incorporation of a parabolic trough mirror collection optics topology 31 as shown in FIG. 6a.

Figure 6A:
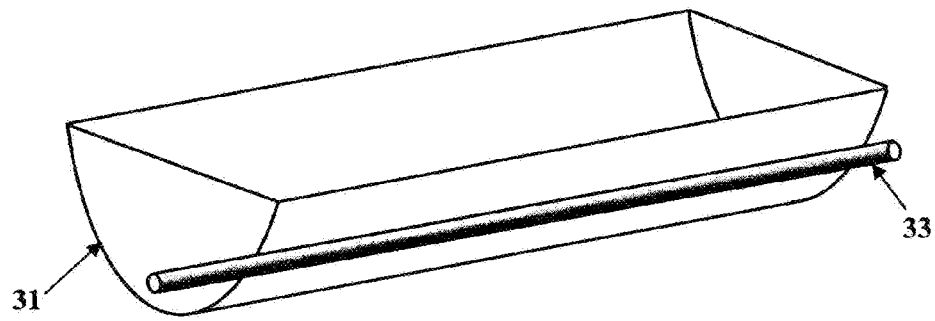
FIG. 6a shows a side pumped fiber/tube amplifier/laser with a parabolic trough mirror collection optics.
Figure 6B:
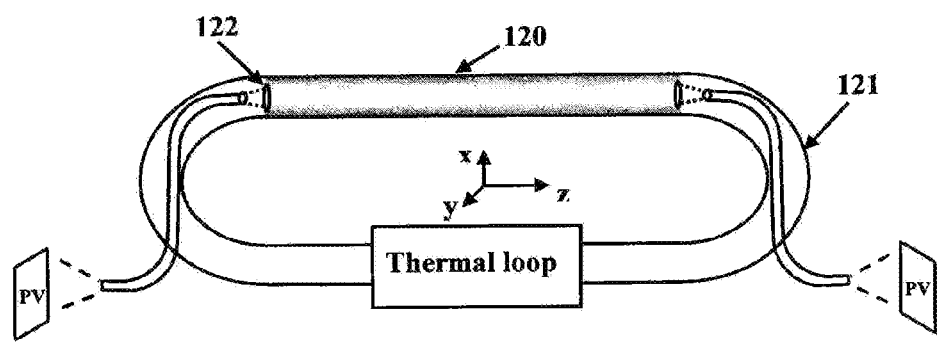
FIG. 6b shows a side pumped tube amplifier/laser of FIG. 6a with a fiber interface.
Figure 6C:
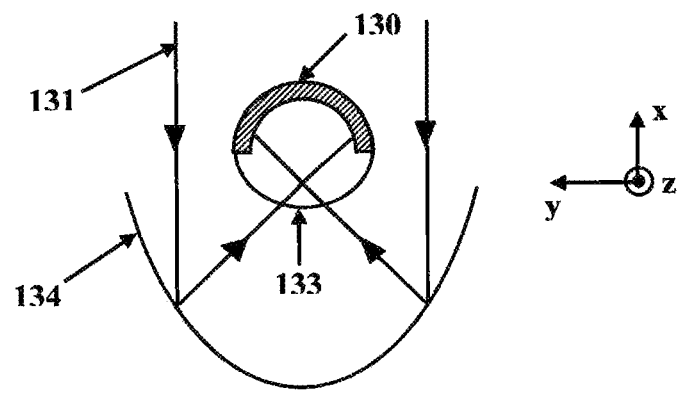
FIG. 6c is a side-view of the tube amplifier/laser with a distributed feedback DFB grating structure at the top of the tube.

The conduction tube 33, now a fiber and/or amplifier and/or laser, can be housed in an insulating tube 120, possibly an evacuated tube, as in FIG. 6b, with lenses and/or mirrors at each end which allow coolant and/or fluorescent dyes to flow into tubing 121 which couples to the remainder of the thermal loop. The light exits via windows, in a manner similar to the entrance optics previous described, and/or via fiber which can be used to couple thermal energy to the tubing 121 and/or filter the light before passing it on to the PVs. A side-view of the trough 134 is provided in FIG. 6c illustrating how the incident light 131 cans pass into the bottom 133 of the tube and any non-absorbed radiation can be reflected from a mirror and/or grating structure 130 at the top of the tube.

Figure 6D:
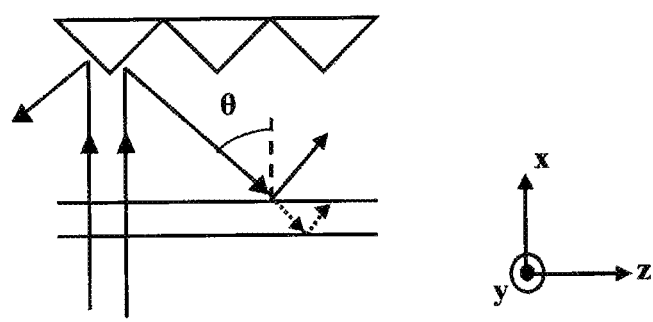
FIG. 6d is an alternate side-view of the tube amplifier/laser showing the mirror/grating reflecting the non-absorbed energy at an angle grater than the critical angle to confine the energy inside the fiber/amplifier/laser.

The alternate side-view of FIG. 6d shows how the mirror/grating can reflect the non-absorbed energy at an angle grater than the critical angle thereby confining the energy to remain inside the fiber/amplifier/laser. The critical angle of either interface, the inner tube to insulating region, or insulating region to air, can be used, however a wave-optics perspective (rather than ray-optics perspective) provides insight as follows. The grating need not be triangular in shape, nor metallic, and can be simply etched on the tube; the grating sets up a coupling of waveguide modes and thereby creates a distributed-feedback (DFB) structure, similar to that utilized in DFB lasers. This thereby eliminates the need for any mirrors at the end of the fiber/amplifier/laser tube.

In addition to the absorption and conductive coupling properties of the fiber, the guidance condition in optical fibers and radiative couplings can also act as a filter to separate and distribute the visible and the infrared radiation. The higher frequency visible light, corresponding to the band to which the photovoltaic has the highest responsivity, can be set for multi-mode propagation corresponding to a wider set of acceptable input angles while the lower frequency infrared is set for single-mode propagation. By tuning the angle of incidence to the fiber, the infrared can be effectively decoupled while the coupling of the visible is relatively unaffected. Similar to the conductive coupling into the coolant of the fiber's absorbed ultraviolet and infrared, this radiative coupling also provides efficient heat transfer into the coolant as the partially-guided/leaky-modes of the infrared continue to radiate further along the fiber. Standard telecommunication grade single mode fiber, which is single-mode at wavelengths near 1550 nm, would be multi-mode at wavelengths of approximately 850 nm, where silicon photovoltaics have a peak response. As a result, inexpensive, readily available fiber can be used.

Another example uses nonlinear optical processes in fiber and/or other components to up-convert the infrared into the visible response band of the photovoltaic. The chromatic aberration of the collection optics and/or entrance optics, or fiber and the absorptive filtering of the fiber or optics, and/or the angle tuning as described in the preceding paragraph, can be used to adaptively, or statically, optimize the amount of infrared that is sent down the fiber for subsequent up-conversion versus the amount that is radiated into the coolant, or in the case of no thermal loop, radiated into free space. The absorption and chromatic aberration of the optics and fiber would statically optimize the spectral transfer initially, then the aberration and angle tuning are readily optimized dynamically by simply moving the fiber longitudinally or rotationally, respectively. The angle tuning and chromatic aberration optimizations could also adapt to ambient conditions such as brightness, coolant temperature, time of day and demand for hot water.

Non-standard fiber to further maximize the heat transfer, in a novel way, can alternatively be employed. The material and thickness of the fiber cladding can be selected to match the infrared wave impedance of the coolant, similar to a "quarter-wave transformer." The spectral range of such a fiber thermal quarter-wave transformer can be broadened by longitudinally modulating the index of refraction of the cladding along the fiber. Alternatively the cladding thickness can be modulated, but the manufacturing of index modulation is readily achieved via ultraviolet photo-etching as in manufacturing fiber Bragg gratings. Fiber Bragg gratings can be used throughout the system, and/or in front of the photovoltaic, to reflect and transfer, via fiber wavelength division multiplexing couplers, any residual infrared not already utilized elsewhere.

Chromatic dispersion, also known as chromatic aberration, of the collection optics can be used for filtering purposes, as described in regard to the example shown in FIG. 1, but it can similarly be used to optimize the amount of blue light coupled into the fiber for subsequent frequency down-conversion and to mitigate the potential of ultraviolet photo-etching of the fibers or damage to the silicon. Note that this can be done in conjunction with the angle tuning of the fiber, and the absorptive filtering aspects of the fiber, to filter out any harmful UV from the enormous energy potential of down-converting the rest of the blue light. Likewise, chromatic dispersion, angle tuning, fiber thermal quarter-wave transformers, and other techniques for maximizing heat transfer into the thermal loop—can also be used to optimize the amount, and the spectrum, of the infrared to be coupled and propagated into the fiber for subsequent frequency up-conversion.

Alternatively, or additionally, frequency conversion can be achieved via any number of, or combinations of, a wide variety of nonlinear optical processes. Resonators can be used to enhance the net efficiency of the frequency conversion process in one or more of the alternative examples previously described. For example, in a second-order (chi-two) process the amount of the frequency converted field is proportional to the square of the incident field. Thus the efficiency of the chi-two conversion itself is proportional to the incident field. Similarly the efficiency of chi-three conversion is proportional to the square of the incident field. Therefore, even if the single-pass conversion in a nonlinear material, such as a fiber, might be small (e.g., say approximately 4%), close to 100% conversion can be achieved by putting the nonlinear material (possibly fiber) in a resonator (possibly a fiber ring resonator) because the field inside the resonator is larger by a factor of approximately $1/(1-r)$ where r; the reflectivity of the resonator mirrors (or input/output couplers) can be made very close to one. Simply put, whatever doesn't get converted in one pass, gets converted in a later pass because it can not get out of the resonator, or ring, until it is converted and output from the frequency selective mirrors (or wavelength division multiplexing couplers).

Figure 7:
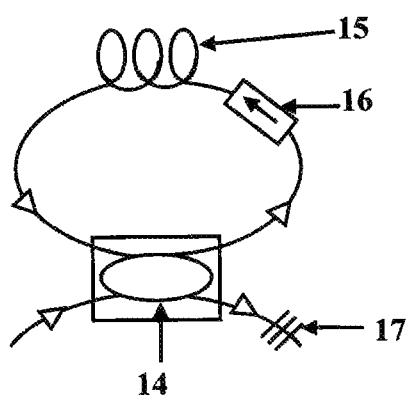
FIG. 7 shows a fiber ring resonator according to the present invention.

Fiber ring resonators provide a cost-effective topology that maintains the thermal distribution advantages of fiber. The fiber ring resonators can be long, or short, loops of nonlinear fiber or fiber/bulk nonlinear optics 15, fusion-spliced to wavelength division multiplexing couplers 14. Optical isolators 16, which are also available in fiber format, can be employed to ensure unidirectional energy rotation in the ring, and FBGs 17 can be used to prevent any residual undesired frequencies from passing on to the photovoltaic, as illustrated in FIG. 7. Shorter loops of fiber could also be used if they have higher nonlinearities and/or if the resonator enhancement is sufficient.

Nonlinearities that can be incorporated into this class of embodiments abound in a variety of fiber, including, but not limited to the following. Second harmonic generation which could provide the infrared up-conversion in PCFs and/or other types of fiber which break the inversion symmetry so that a chi-two process can take place. Virtually any non-isotropic structure or material would suffice, including PCFs, multi-core and/or multi-clad fiber, waveguides with a strong surface wave component. Third and higher-order harmonic generation for up-conversion of the infrared. Parametric down-conversion could down-convert the blue and the UV. Stimulated Raman scattering can also provide and/or contribute to down-conversion. Four-wave mixing processes can be used for up-conversion when used in conjunction with other processes, down-conversion and/or a combined frequency mixing of IR and UV components to produce output frequencies in the visible range.

Some of the energy in the ring, or any other resonator, can excite thermal transitions and these could be coupled into the coolant. Fiber based resonators, including ring resonators, are particularly efficient in providing the thermal distribution. Each ring can be spaced with respect to the other rings, after snaking out from the bundle, the hot spot, to maximize the transfer of undesired heat into the coolant. Likewise, components Within each ring can be positioned per thermal constraints. Moreover, the concentrator can be a honeycomb of Fresnel lenses etched into the plastic or glass that covers the coolant of the thermal loop. Each lens would focus into a fiber bundle that can be suspended in the coolant flow by supports and/or the tension of the fiber and rings connected to the photovoltaic located upstream or remotely, outside of the thermal loop.

Figure 8:
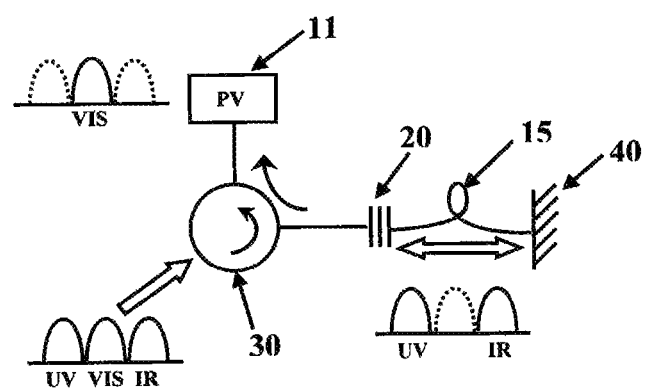
FIG. 8 shows a reflective resonator in a linear topology utilizing an optical circulator.

The example shown in FIG. 8 replaces the use of a coupler with an optical circulator 30. The resonator takes on a linear topology instead of the ring previously described, and includes a fiber Bragg grating or fiber coupled to a bulk optics mirror 20 which reflects the desired visible band back to the circulator which routes it the visible light to the photovoltaic and passes the out-of-band frequencies into the resonant cavity formed by the two mirrors 20 and 40 and the nonlinear fiber or fiber/bulk nonlinear-optics 15, as illustrated in FIG. 8.

Figure 9:
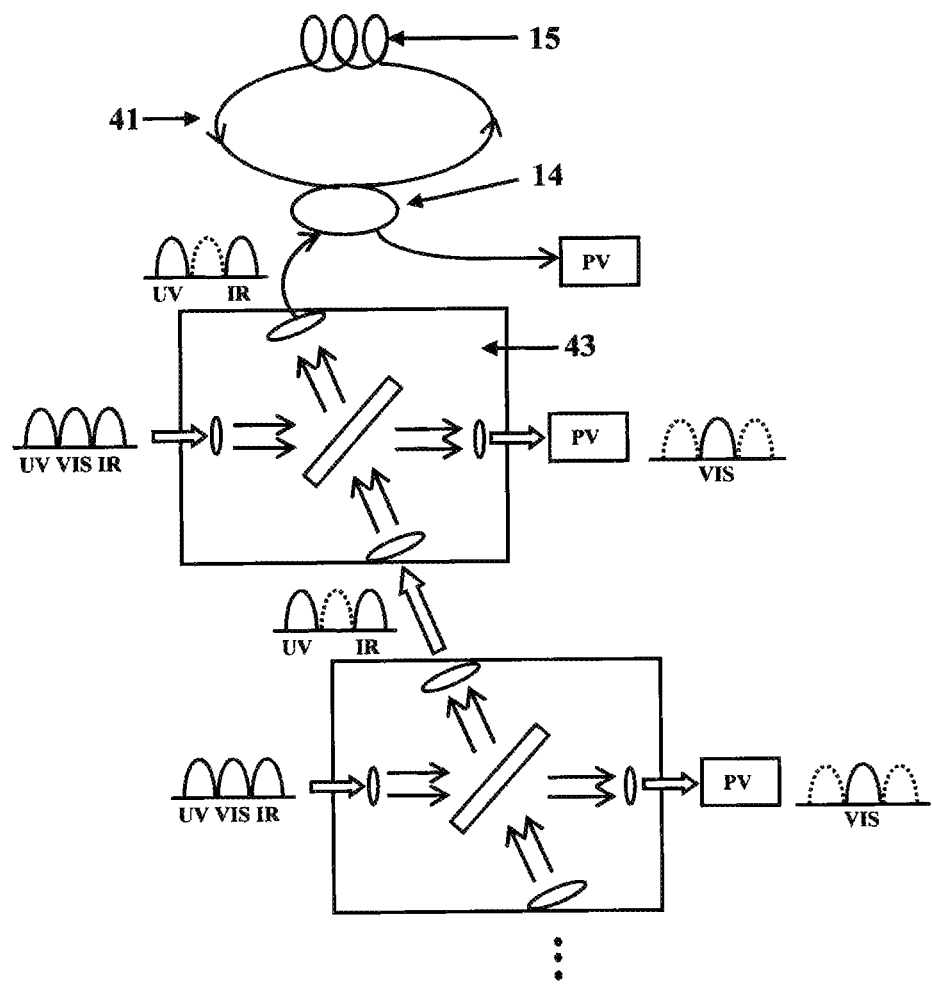
FIG. 9 shows an example using hybrid fiber/bulk-optics beam-splitter modules.

FIG. 9 illustrates a means of removing the out-of-band frequencies from the light that passes onto the photovoltaic, which does not require couplers or circulators and fiber Bragg gratings. It also shows a possible method of combining the energy from several modules, each with their own collection optics. FIG. 9 illustrates the combination of two such modules. These configurations provide the relatively large solar bandwidths desired via hybrid fiber/bulk-optics beam-splitter modules 43. The input and output ports of these modules have fiber connectors, or are fusion spliced to fiber. Lenses, possibly ball lenses, inside the modules expand or contract the beam waists to interface to a bulk-optics beam-splitter or a partially transmitting frequency selective mirror.

Such multi-layered dielectric mirrors include a highly developed industry in bulk-optics and often offer higher bandwidths and higher power capabilities relative to their fiber-optics counterparts, at least relative to many of those that are currently commercially available. Yet, outside the module the energy is still in fiber (with its inherent thermal distribution capabilities) and the entire system can still be immersed in coolant. Each module can feed into its own frequency conversion unit, or they could be combined to feed into a single conversion unit, as shown in FIG. 9 which shows the ring resonator topology. The coupler 42 can be eliminated entirely, replacing it with a linear resonator topology similar to the example shown in FIG. 8 or by simply replacing it with a single-pass frequency conversion unit.

In any of the previously described examples, the collector can receive an already concentrated beam of light from mirror arrays in a solar farm, from solar pumped lasers (via terrestrial, satellite, or platforms elsewhere in the solar system), or from any other directed energy source.

In any of the previously described examples, especially in the super highly concentrated applications, the thermal loop can be replaced by an inexpensive and readily scaleable thermal dump, like a swimming pool, pond, lake, or even an ocean. Since fiber losses can be quite small there is virtually no limit as to the length of these fibers. For example, witness the transoceanic distances in telecommunication systems and the fact that we also can employ optically pumped fiber amplifiers. Hence we can also employ long fiber lengths and make the efficiency of the heat transfer extremely high. Thus, we also can offer a system that although huge, is inexpensive, and capable of converting an immensely intense optical beam into useful electricity.

Even in the super highly concentrated applications, a thermal loop can be utilized, and water would make an ecofriendly coolant. The heat engine can be a simple steam engine, possibly driving even a simple paddle-wheel type of electric generator and the mechanical energy that gets lost as heat is not really lost, since that could be coupled back into the thermal loop.

Figure 10A:
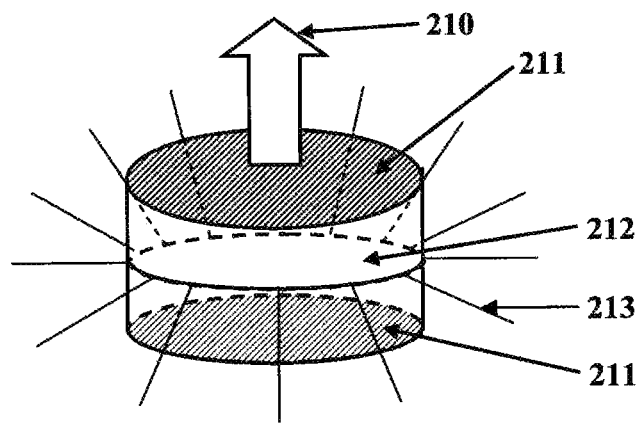
FIG. 10a shows an edge-fired photovoltaic with fiber delivery to the band-gap and solid electrodes.

Fiber also provides novel options for the illumination of the photovoltaic, a simple example being the arrangement of fibers to provide uniform illumination of the surface of a standard photovoltaic cell or an array of cells. In the super highly concentrated realms applications, the delivery of energy from the fiber to the photovoltaic can be accomplished in an edge-fired topology. The photovoltaic is essentially a PN junction 212, similar to that of a diode. This junction can be large, like a large flat disk, and the fiber bundle or rod can splice out into multiple fibers 213, each of which could deliver optical energy to points around the edge of the junction, approximately perpendicular to the huge current 210 that it generates, as illustrated in FIG. 10a.

Figure 10B:
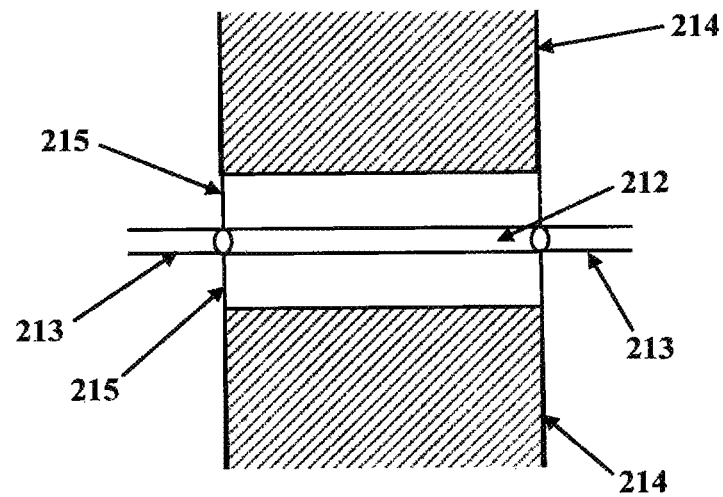
FIG. 10b shows an example using conductors that have an approximately same area as the photovoltaic disk to remove the electricity.

The multiple fibers along the edge impact different paths/locations within the junction while the huge current is reduced to a manageable current density by the surface area of the disk. Moreover, that area can now be totally covered by electrodes 211, on both sides of the photovoltaic, thus dramatically reducing the ohmic losses. Additionally, ohmic losses can further plummet by making the conductors 214 that remove the electricity the same area as the electrodes, the same area of flat side of the photovoltaic disk as shown in FIG. 10b. The electrodes and/or conductors can also provide heat removal and redirection to couple any thermal transitions in the photovoltaic into the thermal conversion loop or thermal dump.

An edge-fired fiber/photovoltaic topology can also be used to mitigate the non-photovoltaic interactions between the optical field and the bulk of the photovoltaic material 215 and its electrodes, thereby reducing heating, dislocation, deformation and other high intensity damage processes. In some applications it would be cost-effective to use superconducting cabling at the photovoltaic site until these high currents can fan out into several standard power station cables. Note in passing that any two-photon and multi-photon transitions in the photovoltaic are still exciting electrons up into the conduction band, and that any undesirable photo-dislocation, mechanical deformation, type of transitions have been mitigated by control through filtering and conversion of the ultraviolet and infrared spectrum of the energy before it impinges onto the photovoltaic.

Lastly, in standard roof-top applications, fiber, most likely with inexpensive Fresnel lens or parabolic dish mirror concentrators can simply deliver heat and light to the inside of a building directly rather than to a photovoltaic or thermal loop during periods of external sunshine. The fiber core diameter can be set to provide partially-guided/leaky-modes in the visible range for the routing of indoor lighting and angle-tuning and/or longitudinal adaptation of the chromatic aberration could dynamically control the brightness and the amount of heat coupled into the building.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A solar energy system with increased photovoltaic and thermal conversion efficiencies comprising:
    a collection optics for receiving and concentrating incident sunlight, or radiation from a directed electromagnetic energy source;
    an entrance optics coupled to receive the incident sunlight, or radiation and direct the incident sunlight or radiation into one end of an optical waveguide or at least one optical fiber that includes an optical filtering unit consisting of the optical waveguide or the at least one optical fiber for absorbing and removing infrared light and ultraviolet light from incoming incident sunlight or radiation, the entrance optics interfacing the collection optics with the optical filtering unit;
    a solar thermal distribution unit conductively coupled with the optical fiber or optical waveguide to absorb heat and redirect the heat from the optical filtering unit into a thermal-loop before visible filtered light is routed to a photovoltaic;
    a frequency converter consisting of one of a side pumped waveguide or an end pumped waveguide or ring resonators to down-convert the ultraviolet light and up-convert the infrared light to a range between approximately 400 to approximately 1125 nm as a visible band that the photovoltaic is responsive to; and
    a photovoltaic responsive to the visible band optically coupled to an opposite end of the optical fiber for receiving the visible filtered light from the frequency converter and convening the visible filtered light into electrical energy, the photovoltaic responsive to a range of wavelengths between approximately 400 and approximately 1125 nm to exclude the removed infrared and ultraviolet light wavelengths.

2. The system of claim 1, wherein the optical waveguide is selected from a group consisting of fiber, bundle of optical fibers, tapered rods, tapered fiber, photonic crystal fiber (PCF), multi-core, multi-clad, slab waveguides and hexagonal rod.

3. The system of claim 1, wherein the optical waveguide is one of a dielectric material or a glass material.

4. The system of claim 1, wherein the optical waveguide uses one of a total internal reflection (TIR) or a transverse resonance to achieve electromagnetic confinement and guidance.

5. The system of claim 1, wherein the collection optics comprises:
    selected from a group consisting of a Fresnel lens, a parabolic dish mirror, and a parabolic trough mirror.

6. The system of claim 1, wherein the entrance optics is selected from a group consisting of window-filter, rod, tapered rod, multi-lens array, ball lens and lensed fiber.

7. The system of claim 1, wherein the filtering by the optical filtering unit is accomplished via at least one of the absorptive properties of the optics and the fiber, the chromatic aberration of the optics and the fiber, waveguiding and angle-tuning of the fiber to optimize the spectral transfer.

8. The system of claim 1, wherein the thermal distribution unit redistributes heat by at least one of a conductive coupling of the heat to the thermal loop and a radiative coupling the heat from the optical filtering unit into the thermal loop.

9. The system of claim 1, wherein the at least one optical fiber comprises at least one of a fiber bundle of input heads that are epoxied together, a fiber bundles of input heads that are fused together, a fiber bundle of input heads having claddings removed and cores fused together, a metallic ferrule for housing the fiber bundle of input heads, and a heat sink mesh between fibers in a bundle.

10. The system of claim 1 wherein the thermal distribution unit further comprises:
a coolant, the optical fibers routed through the coolant.

11. The system of claim 10, wherein the solar thermal distribution unit comprises:
a heat pipe or heat pipes arrayed conductively coupled in a radial arm along a length of the optical fiber to surround the length of the optical fiber with a fluid entrance at the collection optics and a fluid exit approximately at the photovoltaic to transfer thermal energy from the collection optics into a manifold that interfaces the coolant flow to the rest of the thermal loop.

12. The system of claim 11 wherein the coolant, heat pipe or heat pipes arrayed in a radial arms to form the ring topology are thermally insulated.

13. The system of claim 12 wherein the thermal insulation is provided by an evacuated glass tube.

14. The system of claim 1 wherein the at least one optical fiber comprises a bundle of optical fibers that are pumped to form pumped fiber amplifiers.

15. The system of claim 14 further comprising:
one of a mirror and a fiber Bragg grating coupled to both ends of the at least one optical fibers to form pumped fiber lasers.

16. The system of claim 1 comprising an inner conduction tube which forms a single fiber amplifier with waveguiding of the amplifier providing a preferred direction for the re-radiation of the solar pumped molecules or atoms undergoing stimulated emission of radiation.

17. The system of claim 16 further comprising:
an optical device positioned at each ends of the inner conduction tube enhancing the direction for a stimulated emission, turning the amplifier into an end pumped laser.

18. The system of claim 17 wherein the laser is end pumped by one of a Fresnel lens and a dish mirror.

19. The system of claim 16 further comprising of:
a trough mirror and grating at top of tube providing distributed feedback (DFB), turning the amplifier into a side pumped laser.

20. The system of claim 1 wherein the frequency conversion is resonantly enhanced in an optical resonator selected from a group consisting of one of a fiber ring resonators incorporating couplers, a fiber ring resonators incorporating hybrid fiber/bulk-optics modules, a reflective resonators incorporating optical circulators and a fiber Bragg grating FBG and a mirror, and a fiber based resonator.

21. The system of claim 1 wherein the collector comprises:
a concentrated light beam source is one of an array of mirrors in a solar farm, a solar pumped lasers from one of a terrestrial, satellite, or platforms in the solar system, the collector receiving the concentrated light beam.

22. The system of claim 1 wherein the thermal distribution unit comprises:
a thermal dump.

23. The system of claim 22 wherein the thermal dump is selected from a group consisting of a swimming pool, a lake, a pond and an ocean.

24. The system of claim 1, wherein the thermal loop includes an electric generator driven by a heat engine.

25. The system of claim 24 wherein the electric generator is one of a paddle wheel type electric generator, a Sterling engine, a thermal electric engine, absorption chiller, a thermal engine and a thermal-quarter-wave transformer.

26. The system of claim 1 wherein the optical filtering unit comprises:
optical fibers and exit optics to provide uniform illumination of the surface of the photovoltaic cell.

27. The system of claim 26 wherein the exit optics is one of plural fibers, a collimating lens, and a multilens array.

28. The system of claim 1, wherein the photovoltaic is an edge-fired photovoltaic with a fiber delivery system.

29. The system of claim 1 wherein the photovoltaic is an edge-fired photovoltaic, the system further comprising:
a fiber delivery system comprising:
a photovoltaic PN junction formed into a flat disk having plural electrodes covering each side of the flat surface to reduce ohmic losses;
a fiber bundle splicing out into groups of multiple fibers, each of which delivers optical energy to points around an edge of the photovoltaic PN junction, approximately perpendicular to a current it generates, the surface area of the flat disk reducing the current density; and
at least one conductor to remove the electricity which are the same area as the electrodes; also providing heat removal and redirection into the thermal conversion.

* * * * *